United States Patent
Khouri et al.

(10) Patent No.: US 6,816,404 B2
(45) Date of Patent: Nov. 9, 2004

(54) ARCHITECTURE OF A PHASE-CHANGE NONVOLATILE MEMORY ARRAY

(75) Inventors: Osama Khouri, Milan (IT); Ferdinando Bedeschi, Taranto (IT); Giorgio Bosisio, Robbiate (IT); Fabio Pellizzer, Follina (IT)

(73) Assignees: STMicroelectronics S.r.l., Agrate Brianza (IT); OVONYX, Inc., Boise, ID (US)

( * ) Notice: Subject to any disclaimer, the term of this patent is extended or adjusted under 35 U.S.C. 154(b) by 0 days.

(21) Appl. No.: 10/319,439

(22) Filed: Dec. 12, 2002

(65) Prior Publication Data

US 2003/0185047 A1 Oct. 2, 2003

(30) Foreign Application Priority Data

Dec. 27, 2001 (EP) .............................................. 01830806

(51) Int. Cl.[7] ................................................. G11C 7/00
(52) U.S. Cl. ....................... 365/163; 365/174; 365/175
(58) Field of Search ................................. 365/163, 174, 365/175, 113, 105

(56) References Cited

U.S. PATENT DOCUMENTS

| | | | |
|---|---|---|---|
| 4,599,705 A | 7/1986 | Holmberg et al. | 365/463 |
| 4,876,668 A | 10/1989 | Thakoor et al. | 365/163 |
| 5,801,983 A | * 9/1998 | Saeki | 365/149 |
| 5,883,827 A | 3/1999 | Morgan | 365/100 |
| 5,898,619 A | * 4/1999 | Chang et al. | 365/185.23 |
| 6,314,014 B1 | 11/2001 | Lowrey et al. | 365/100 |
| 6,590,807 B2 | * 7/2003 | Lowrey | 365/175 |
| 6,673,648 B2 | * 1/2004 | Lowrey | 438/102 |

* cited by examiner

Primary Examiner—Vu A. Le
(74) Attorney, Agent, or Firm—Lisa K. Jorgenson; Robert Iannucci; Seed IP Law Group PLLC (57) ABSTRACT

The phase-change nonvolatile memory array is formed by a plurality of memory cells extending in a first and in a second direction orthogonal to each other. A plurality of column-selection lines extend parallel to the first direction. A plurality of word-selection lines extend parallel to the second direction. Each memory cell includes a PCM storage element and a selection transistor. A first terminal of the selection transistor is connected to a first terminal of the PCM storage element, and the control terminal of the selection transistor is connected to a respective word-selection line. A second terminal of the PCM storage element is connected to a respective column-selection line, and a second terminal of the selection transistor is connected to a reference-potential region while reading and programming the memory cells.

14 Claims, 6 Drawing Sheets

ARCHITECTURE OF A PHASE-CHANGE NONVOLATILE MEMORY ARRAY

BACKGROUND OF THE INVENTION

1. Field of the Invention

The present invention relates to the architecture of a phase-change nonvolatile memory array.

2. Description of the Related Art

As is known, phase-change memory (PCM) arrays are based on storage elements that use a class of materials which have the property of changing between two phases having distinct electrical characteristics. For example, these materials may change from an amorphous, disorderly phase to a crystalline or polycrystalline, orderly phase, and the two phases are associated to considerably different values of resistivity.

At present, alloys of elements of group VI of the periodic table, such as Te or Se, referred to as chalcogenides or chalcogenic materials, can advantageously be used in phase-change cells. The chalcogenide that currently offers the most promise is formed by a Ge, Sb and Te alloy ($Ge_2Sb_2Te_5$) and is widely used for storing data in overwritable disks.

Figure 1:
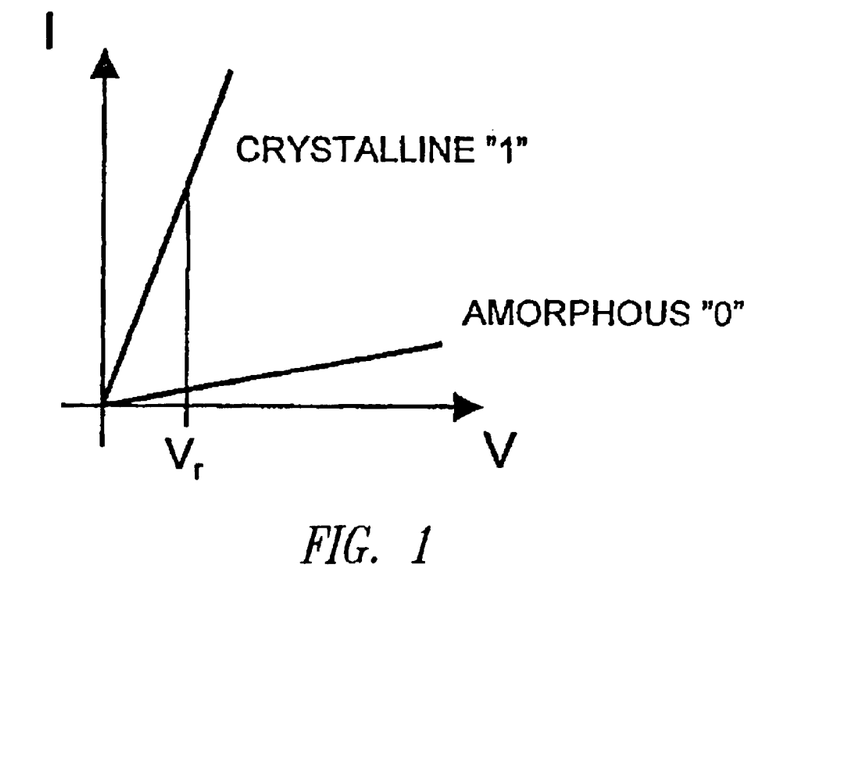
FIG. 1 shows the current-versus-voltage characteristic of a phase-change material.

In chalcogenides, the resistivity varies by two or more orders of magnitude when the material passes from the amorphous phase (more resistive) to the crystalline phase (more conductive) and vice versa. The characteristics of the chalcogenides in the two phases are shown in FIG. 1. As may be noted, at a given read voltage, here designated by Vr, there is a variation in resistance of more than 10.

Figure 2:
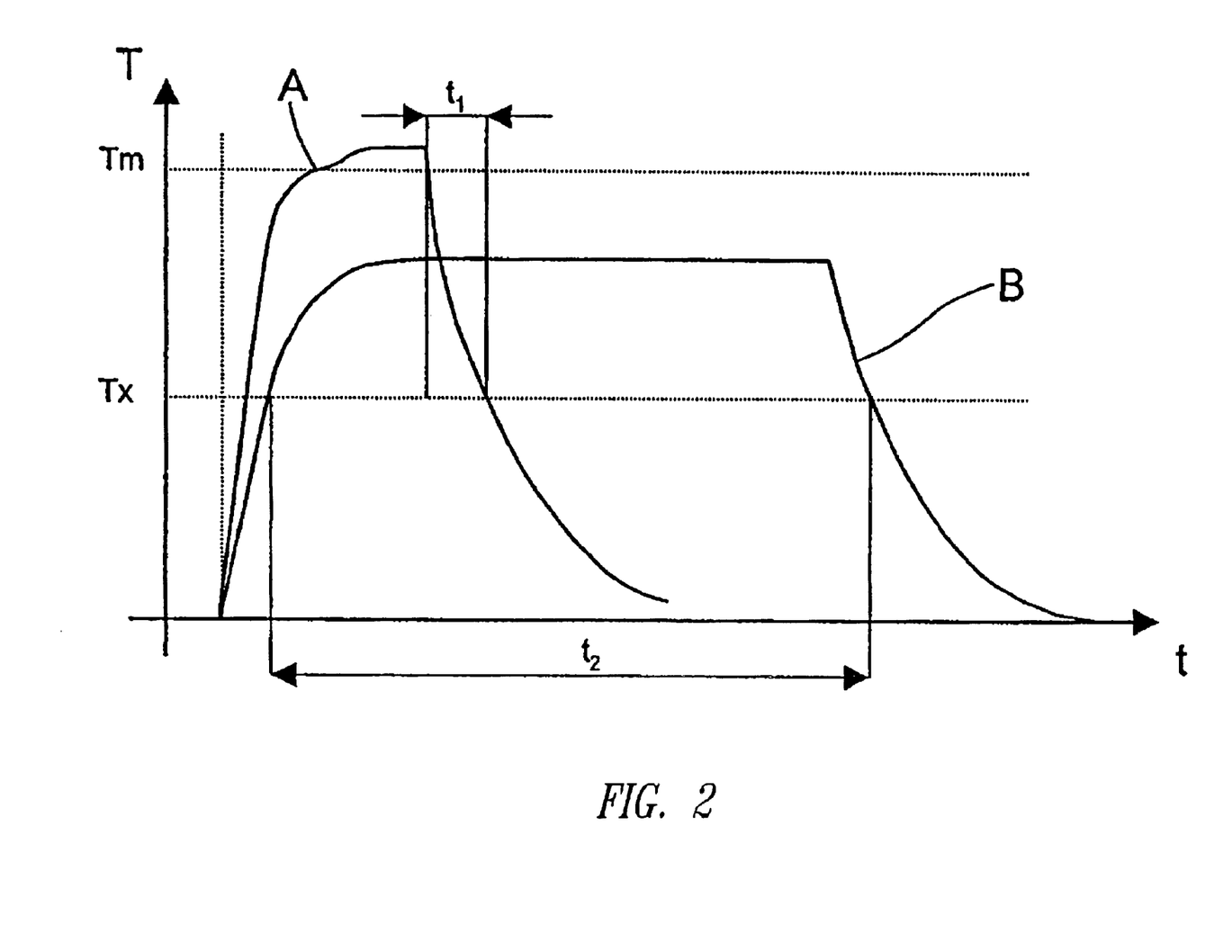
FIG. 2 shows the temperature-versus-current plot of a phase-change material.

Phase change may be obtained by locally increasing the temperature, as shown in FIG. 2. Below 150° C. both phases are stable. Above 200° C. (nucleation starting temperature, designated by $T_x$), there takes place fast nucleation of the crystallites, and, if the material is kept at the crystallization temperature for a sufficient length of time (time $t_2$), it changes its phase and becomes crystalline. To bring the chalcogenide back into the amorphous state, it is necessary to raise the temperature above the melting temperature $T_m$ (approximately 600° C.) and then to cool the chalcogenide off rapidly (time $t_1$).

From the electrical standpoint, it is possible to reach both the critical temperatures, namely the crystallization temperature and the melting point, by causing a current to flow through a resistive element which heats the chalcogenic material by the Joule effect.

The basic structure of a phase-change storage element 1 which operates according to the principles described above is shown in FIG. 3 and comprises a resistive element 2 (heater) and a programmable element 3. The programmable element 3 is made with a chalcogenide and is normally in the crystalline state in order to enable a good flow of current. One part of the programmable element 3 is in direct contact with the resistive element 2 and forms a phase-change portion 4.

Figure 3:
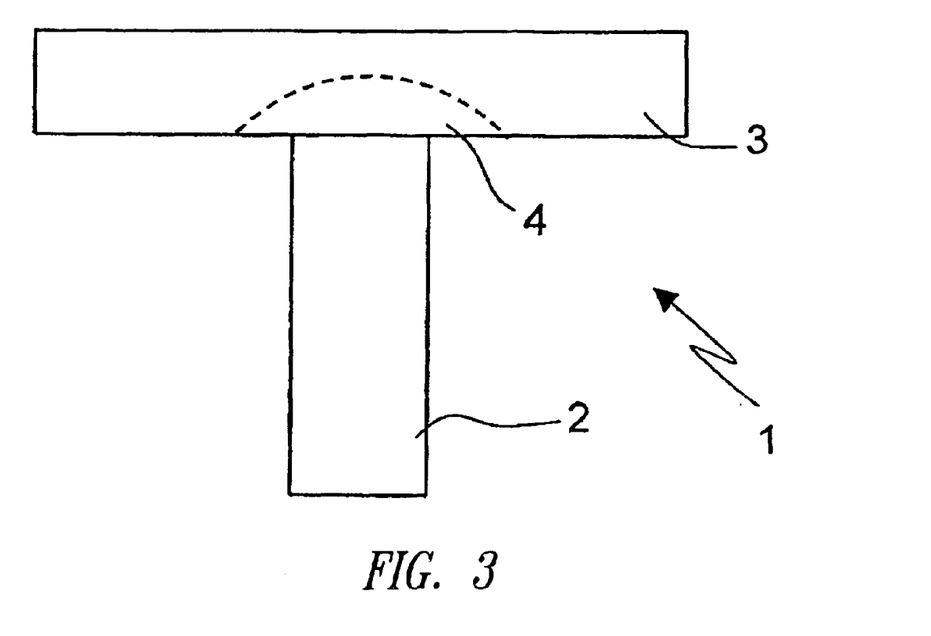
FIG. 3 shows the basic structure of a PCM storage element.

If an electric current having an appropriate value is made to pass through the resistive element 2, it is possible to heat the phase-change portion 4 selectively up to the crystallization temperature or to the melting temperature and to cause phase change.

The state of the chalcogenic material can be measured by applying a sufficiently small voltage, such as not to cause a sensible heating, and by then reading the current that is flowing. Given that the current is proportional to the conductivity of the chalcogenide, it is possible to discriminate wherein state the chalcogenide is.

Of course, the chalcogenide can be electrically switched between different intermediate states, thus affording the possibility of obtaining a multilevel memory.

In practice, a phase-change memory element or PCM storage element 1 can be considered as a resistor which conducts a different current according to its phase. In particular, the following convention is adopted: a phase-change storage element is defined as "set" when, once it is appropriately biased, it conducts a detectable current (this condition may be associated to a logic condition "1") and as "reset" when, in the same biasing conditions, it does not conduct current or conducts a much lower current than that of a cell that is set (logic condition "0").

The use of PCM storage elements has already been proposed in memory arrays formed by a plurality of memory cells arranged on rows and columns. In order to prevent the memory cells from being affected by noise caused by adjacent memory cells, generally each memory cell comprises a PCM storage element of the type described above and a selection element, such as a MOS transistor or a diode, in series to the PCM storage element.

When the selection element is a diode, each cell is connected at the intersection of two selection lines, perpendicular to one another, one of which is parallel to the rows of the memory array, while the other is parallel to the columns.

When the selection element is a transistor, different solutions are known which are essentially based upon biasing the source terminal of the selection element at variable voltages that depend upon the reading or programming operation (set, reset) of the memory. For example, according to U.S. Pat. No. 6,314,014, a first terminal of the PCM storage element is biased at a biasing voltage the value of which depends upon the operation (either reading or programming) of the cell, a second terminal of the PCM storage element is connected to a drain terminal of the selection transistor, the gate terminal of the selection transistor is connected to a row line, and the source terminal of the selection transistor is connected to a column line. In practice, selection of the cell takes place via the source and gate terminals of the selection transistor. Alternatively, the drain terminal of the selection transistor can be biased at the biasing voltage, and the memory cell 1 can be coupled between the source terminal and its own column line.

All the above known solutions thus entail biasing of three different terminals of the cell, and hence special biasing lines, which complicate the circuits associated to the memory array. In addition, on account of the non-zero biasing of the source region, there is a sensible body effect, which determines an increase in the threshold voltage of the selection transistor, and hence of the voltage that is to be generated and fed within the memory, of course involving additional costs.

BRIEF SUMMARY OF THE INVENTION

An embodiment of the present invention provides an architecture for phase-change memory arrays which will overcome the disadvantages of the prior art solutions.

An embodiment of the present invention is directed to a phase-change nonvolatile memory array formed by a plurality of memory cells extending in a first and in a second direction orthogonal to each other. A plurality of column-selection lines extend parallel to the first direction. A plurality of word-selection lines extend parallel to the second direction. Each memory cell includes a PCM storage element and a selection transistor. A first terminal of the selection transistor is connected to a first terminal of the PCM storage element, and the control terminal of the selection transistor is connected to a respective word-selection line. A second terminal of the PCM storage element is connected to a respective column-selection line, and a second terminal of the selection transistor is connected to a reference-potential region while reading and programming the memory cells.

BRIEF DESCRIPTION OF THE SEVERAL VIEWS OF THE DRAWINGS

For a better understanding of the present invention, preferred embodiments thereof are now described, purely as non-limiting examples, with reference to the attached drawings, wherein.

DETAILED DESCRIPTION OF THE INVENTION

Figure 4:
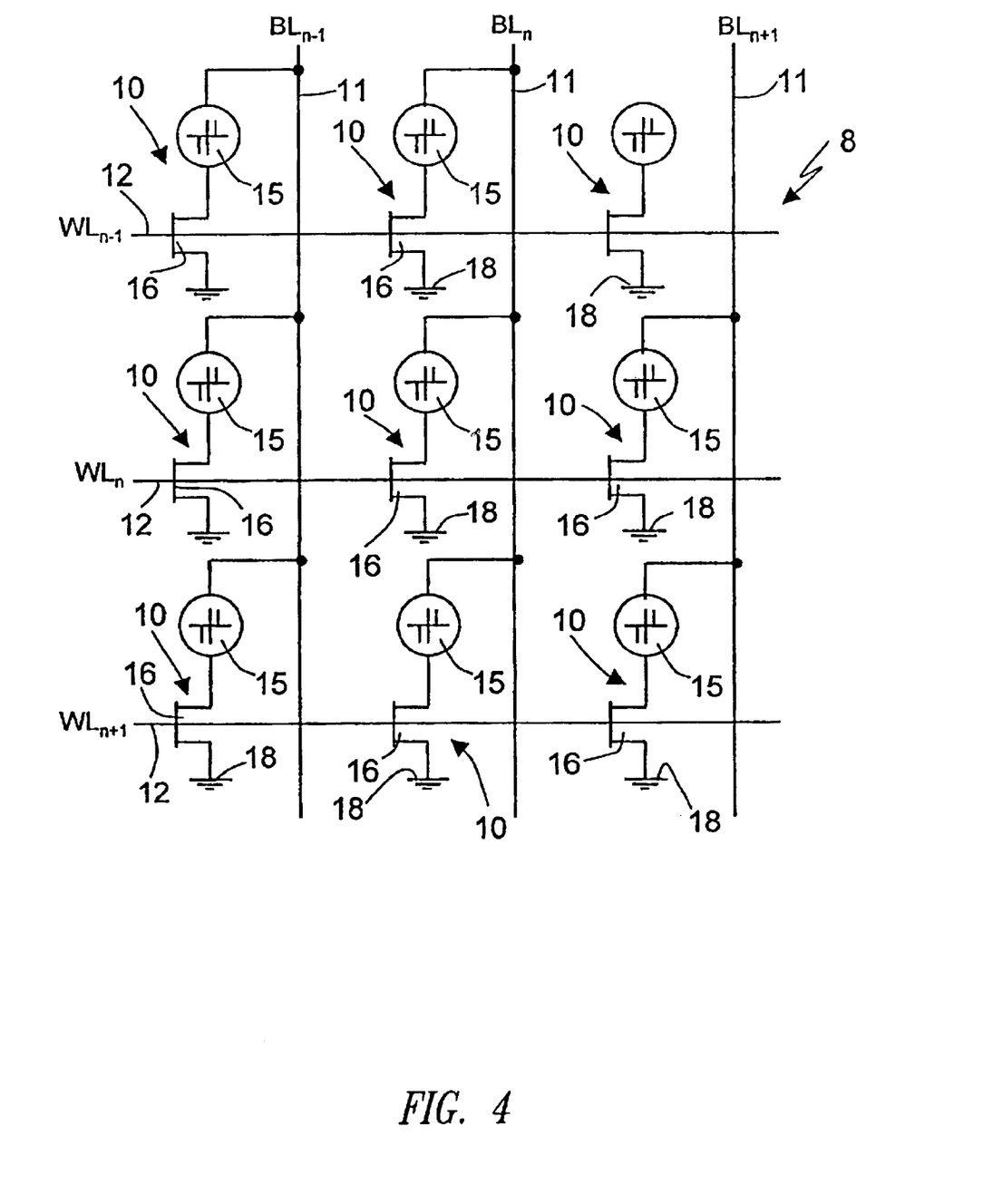
FIG. 4 illustrates the architecture of a memory array according to the invention.

With reference to FIG. 4, a memory array 8 comprises a plurality of memory cells 10 arranged according to rows and columns and connected to bit lines 11 (parallel to the columns of the memory array 8) and word lines 12 (parallel to the rows of the memory array 8).

Each memory cell 10 is formed by a PCM storage element 15 and a selection element 16.

The PCM storage element 15 is made like the PCM storage element 1 of FIG. 3 and comprises a heating element and a programmable element (which are not illustrated).

The selection element 16 is formed by an NMOS transistor, preferably of low-threshold type.

In each memory cell 10, the gate terminal of the NMOS transistor 16 is connected to the respective word line 12 having address $WL_{n-1}$, $WL_n$, $WL_{n+1}$, . . . , the source terminal (during normal operation of the memory array 8, namely during reading or setting and resetting operations) is connected to a ground region 18, and the drain terminal is connected to a first terminal of the PCM storage element 15. A second terminal of the PCM storage element 15 is connected to a respective bit line 11 having address $BL_{n-1}$, $BL_n$, $BL_{n+1}$, . . . .

In the memory array 8 it is possible to program or read a single memory cell 10 by appropriately biasing the bit line 11 and the word line 12 connected thereto. All the bit lines 11 and all the word lines 12 that are not addressed must be grounded.

Figure 5:
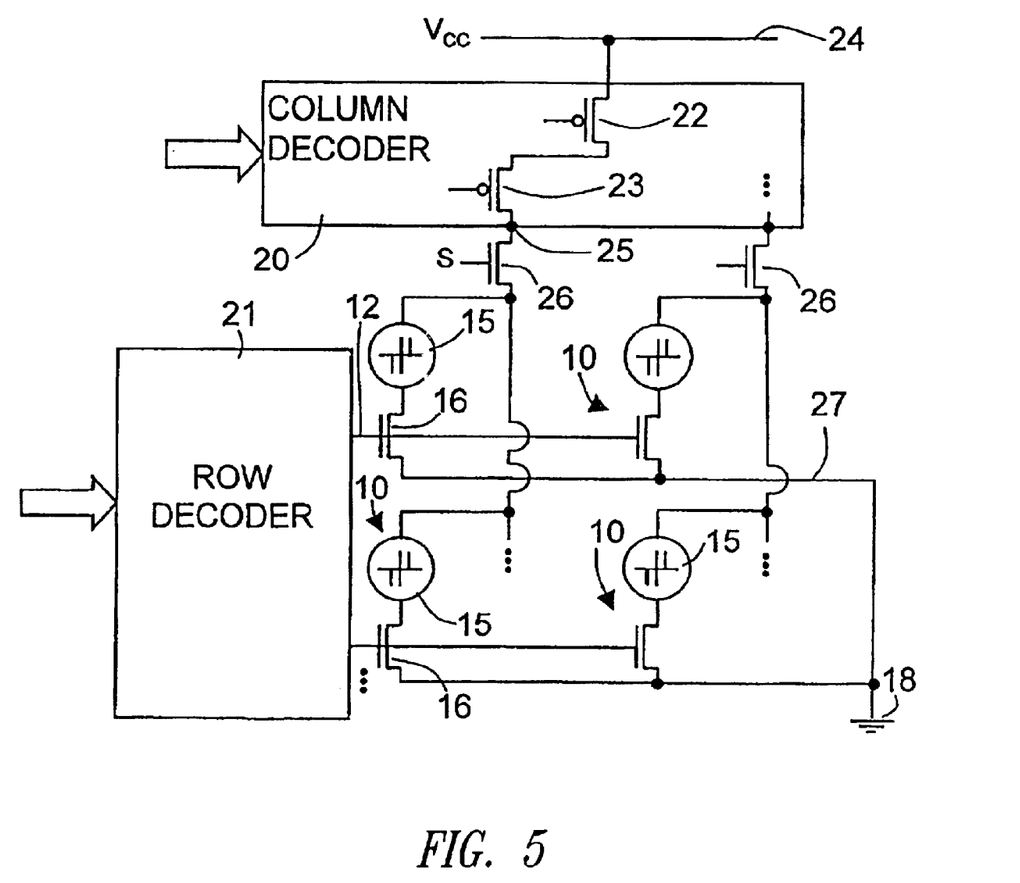
FIG. 5 shows the simplified circuit diagram of a cell connected to respective column selection elements.

FIG. 5 shows a possible addressing diagram for a memory cell 10 through a column decoder 20 and a row decoder 21. In particular, of the column decoder 20 there are shown two selection transistors 22, 23 connected between a supply line 24 set at Vcc and a function-selection node 25. The selection transistors 22, 23 are PMOS transistors, connected in series, and are driven by address signals which supply appropriate voltages for selecting/deselecting the transistors.

The function-selection node 25 is connected to a drain terminal of a function-selection transistor 26, of NMOS type, which has a source terminal connected to a respective bit line 11.

The function-selection transistor 26 is used for selecting the operation (set/reset or read) to be carried out on the selected memory cell 10; thereby it receives an appropriate operation-selection signal S.

FIG. 5 moreover illustrates four memory cells 10 the selection transistors 16 of which are connected to the ground region 18 through a source line 27.

In each memory cell 10, the gate terminal of the NMOS transistor 16 is connected to a respective word line 12 coming form the row decoder 21.

The NMOS transistors 16 are preferably natural transistors, namely ones that have not undergone a step of threshold-modification implantation. Consequently, the NMOS transistors 16 have a low threshold voltage (as low as 0 V). Consequently, they require a lower voltage than standard transistors to reach a same operating point (i.e., to feed the same amount of current). The leakage currents of these transistors are not, on the other hand, important, in so far as they are limited by the selection transistors 22, 23 of the column decoder 21.

Figure 6:
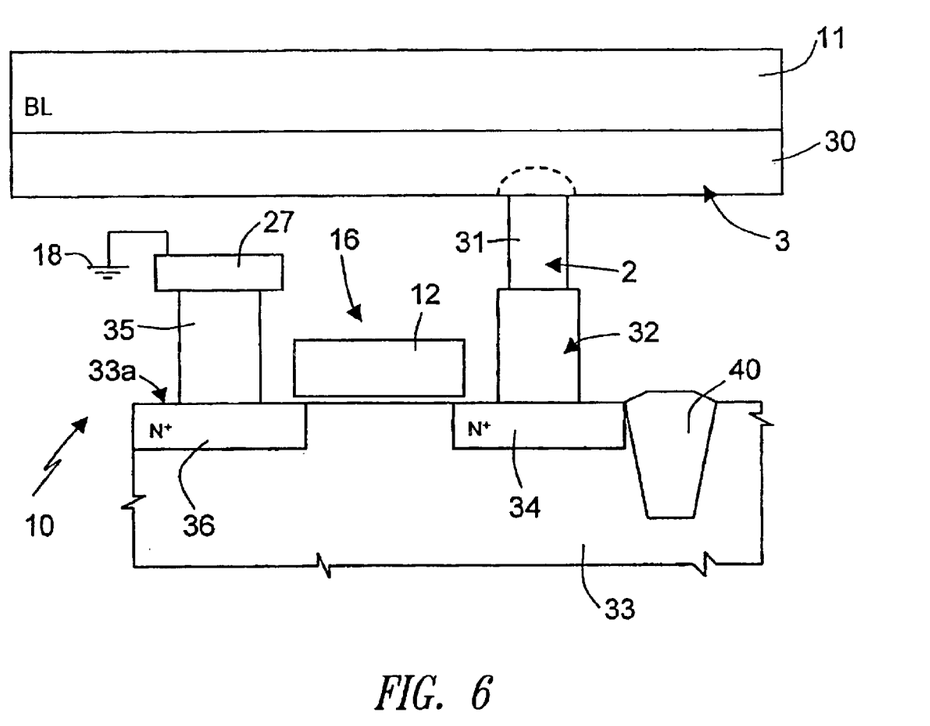
FIG. 6 illustrates the structure of a memory cell that can be used in the memory array of FIG. 4.

FIG. 6 illustrates the embodiment of a memory cell 10. As shown, a metal bit line 11 extends in a first direction of the memory cell 10 and is in contact with a strip 30 of chalcogenic material corresponding to the programmable element 3 of FIG. 3. A resistive element 31 (preferably of TiSiN and corresponding to the resistive element 2 of FIG. 3) extends vertically and is in direct contact at the top with the strip 30 and at the bottom with a first pillar plug 32. The first plug 32 extends as far as a surface 33a of a substrate 33, and is here in contact with a drain region 34 of the $N^+$ type. The substrate 33 is of the P type, and the portion between the drain region 34 and the source region 36 forms a channel region. A word line 12, of polysilicon, extends on top of the substrate 33 and is insulated from the latter. A second plug 35, of metal, connects the source region 36, of $N^+$ type, formed in the substrate 33, to the ground region 18, through the source line 27. An insulating region 40, of oxide, for example made using the shallow-trench technique, surrounds the area of the substrate 33 housing the cell 10.

The plugs 32, 35 are preferably made as tungsten local interconnections. The second plug 35 can be connected to the ground region 18 either directly, via a single source line 27, or with the interposition of a special selector which enables selective connection of one memory cell 10 or a group of memory cells 10 to the ground region 18. The source region 36 and the second plug 35 are preferably shared with an adjacent memory cell 10 (shown on the left in FIG. 6).

The word line 12 forms the gate electrode of the NMOS transistor 16. Its resistivity can be lowered by silicidation (for instance, with tungsten, titanium, cobalt or nickel) or using the metal-strap technique.

The bit line BL is a multilayer line and comprises a barrier layer (of titanium or titanium nitride—not shown) overlaid on the strip 30 and separating the chalcogenic material of the strip 30 from the metal (for example AlCu) used for reducing the resistivity of the bit line 11.

There may moreover be provided a metal line parallel to the bit line 11 (or to the word line 12) for reducing their resistivity, and hence increasing the speed of access to the memory cell 10.

Furthermore, it is possible to form contacts on the source line 27 so as to simplify current sinking.

Figure 7:
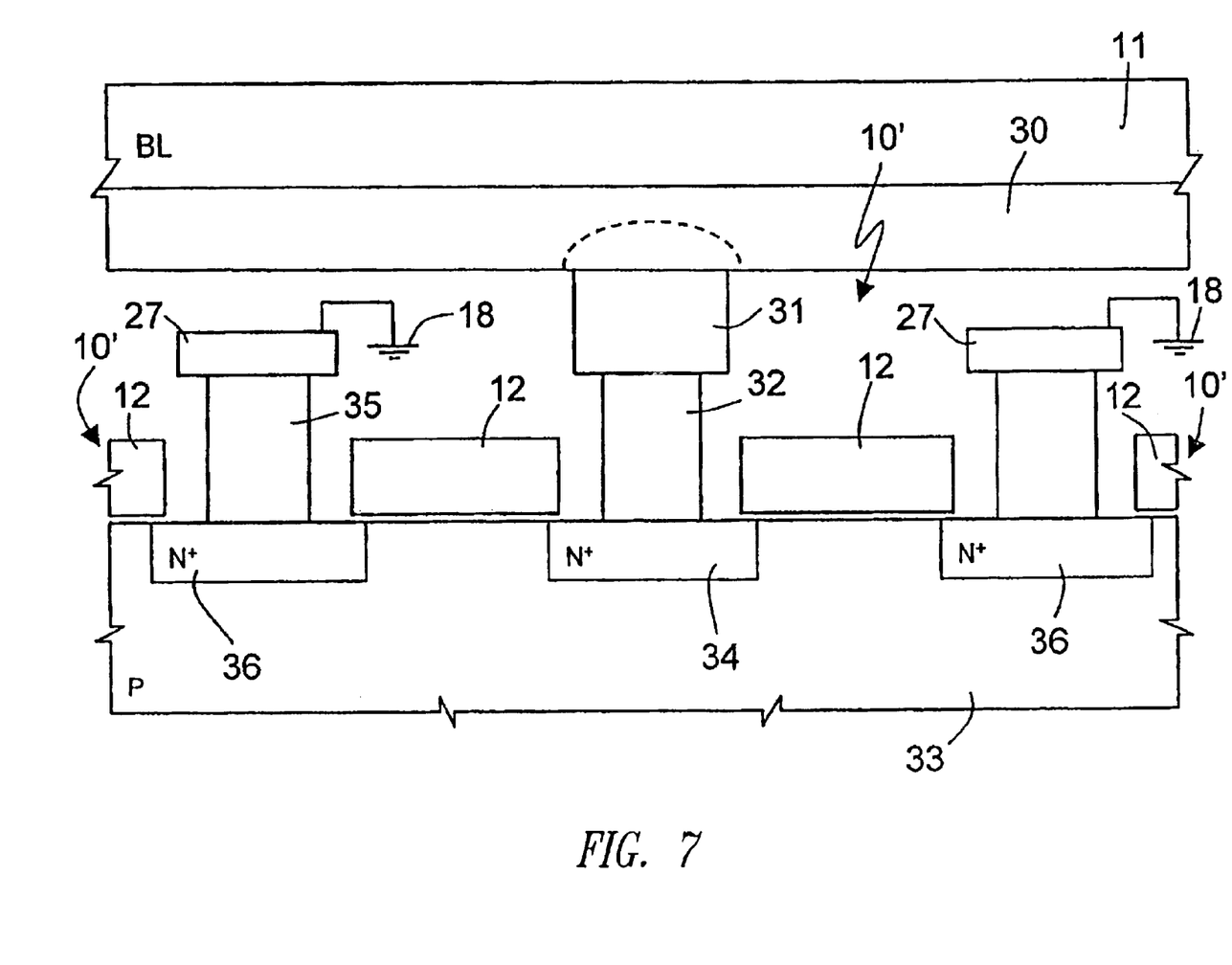
FIG. 7 illustrates a different structure of a memory cell that can be used in the memory array of FIG. 4.

FIG. 7 illustrates a different embodiment of a split-gate cell 10'. As may be noted, the split-gate cell 10' has a symmetrical structure with respect to a vertical plane passing through the center of the first plug 32. Consequently, the split-gate cell 10' of FIG. 7 has two gate regions 12, two source regions 36, two second plugs 35, and two source lines 27 which are connected to ground. The gate regions 12 are connected in parallel, as are the source regions 36; consequently, the split-gate cell 10' is electrically equivalent to the memory cell 10 of FIG. 6.

Moreover, analogously to the embodiment of FIG. 6, the two source regions 36 and the two source lines 27 may be shared with two adjacent split-gate cells 10', one on the left and one on the right.

The embodiment of FIG. 7 affords the advantage that no field insulation is required (insulating region 40 of FIG. 6) for insulating the drain regions 34 (on which the PCM storage element 15 is formed) of adjacent cells in the direction of the bit line 11, since the insulation between adjacent cells is obtained due to the presence of the two gate regions 12. There are no corners of active area within the memory array, and the defects are considerably reduced (as is the leakage caused by these defects).

The split-gate cell 10' of FIG. 7 is longer in the direction of the bit line 11 than the memory cell 10 of FIG. 6, but this disadvantage can be partly offset by reducing the gate width W. In fact, with the same gate width W, the output current of the split-gate cell 10' is twice that of the memory cell 10 of FIG. 6.

The advantages of the memory array described herein are illustrated hereinafter. In the first place, the cells are not affected by the body effect, since the source terminals of the selection transistors are connected to ground. The use of selection transistors of a low-threshold type enables driving currents of adequate values to the cells during programming; that is, it enables a reduction of the programming voltages and/or of the area occupied in the chip. Metal straps on the source line are not strictly necessary. The resulting architecture is very similar to the standard architecture in NOR-type flash memories, and consequently it is possible to use selection and accessory circuitry of a known type.

Finally, it is clear that numerous modifications and variations may be made to the memory array described and illustrated herein, all falling within the scope of the invention, as defined in the attached claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

We claim:

1. A phase-change nonvolatile memory array, comprising:
    a plurality of column-selection lines extending in a first direction;
    a plurality of word-selection lines extending in a second direction, orthogonal to the first direction; and
    a plurality of memory cells extending in the first and second directions, each of said memory cells comprising a PCM storage element and a corresponding selection transistor, each of said PCM storage elements having a first and a second terminal, and each of said selection transistors having a first, a second, and a control terminal, said first terminal of each of said selection transistors being connected to said first terminal of said corresponding PCM storage element, and said control terminal of each of the selection transistors being connected to a respective one of said word-selection lines, said second terminal of each of said PCM storage elements being connected to a respective one of said column-selection lines, and said second terminal of each of said selection transistor is connected to a reference-potential region while reading and programming said memory cells, wherein said selection transistor is of NMOS type and is a low-threshold transistor.

2. The phase-change nonvolatile memory array according to claim 1, wherein said column-selection lines are connected to a column-decoder circuit, and said word-selection lines are connected to a row-decoder circuit.

3. A phase-change nonvolatile memory array, comprising:
    a plurality of column-selection lines extending in a first direction;
    a plurality of word-selection lines extending in a second direction, orthogonal to the first direction; and
    a plurality of memory cells extending in the first and second directions, each of said memory cells comprising a PCM storage element and a corresponding selection transistor, each of said PCM storage elements having a first and a second terminal, and each of said selection transistors having a first, a second, and a control terminal, said first terminal of each of said selection transistors being connected to said first terminal of said corresponding PCM storage element, and said control terminal of each of the selection transistors being connected to a respective one of said word-selection lines, said second terminal of each of said PCM storage elements being connected to a respective one of said column-selection lines, and said second terminal of each of said selection transistor is connected to a reference-potential region while reading and programming said memory cells, wherein said column-selection lines are connected to a column-decoder circuit, said word-selection lines are connected to a row-decoder circuit, and said column-decoder circuit comprises PMOS transistors connected in series between a supply line and a respective output of said column-decoder circuit.

4. A phase-change nonvolatile memory array, comprising:
    a plurality of column-selection lines extending in a first direction;
    a plurality of word-selection lines extending in a second direction, orthogonal to the first direction; and
    a plurality of memory cells extending in the first and second directions, each of said memory cells comprising a PCM storage element and a corresponding selection transistor, each of said PCM storage elements having a first and a second terminal, and each of said selection transistors having a first, a second, and a control terminal, said first terminal of each of said selection transistors being connected to said first terminal of said corresponding PCM storage element, and said control terminal of each of the selection transistors being connected to a respective one of said word-selection lines, said second terminal of each of said PCM storage elements being connected to a respective one of said column-selection lines, and said second terminal of each of said selection transistor is connected to a reference-potential region while reading and programming said memory cells, wherein said column-selection lines are connected to a column-decoder circuit, said word-selection lines are connected to a row-decoder circuit, each column-selection line is connected to said column-decoder circuit through a function-selection transistor coupled between a respective output of said column-decoder circuit and a respective column-selection line, and the function-selection transistor has a control terminal receiving an operation-selection signal.

5. The phase-change nonvolatile memory array according to claim 4 wherein said function selection transistor is of NMOS type.

6. A phase-change nonvolatile memory array, comprising:
a semiconductor material body;
a plurality of column-selection lines extending in a first direction;
a plurality of word-selection lines extending in a second direction, orthogonal to the first direction; and
a Plurality of memory cells extending in the first and second directions, each of said memory cells comprising a PCM storage element and a corresponding selection transistor, each of said PCM storage elements having a first and a second terminal, and each of said selection transistors having a first, a second, and a control terminal, said first terminal of each of said selection transistors being connected to said first terminal of said corresponding PCM storage element, and said control terminal of each of the selection transistors being connected to a respective one of said word-selection lines, said second terminal of each of said PCM storage elements being connected to a respective one of said column-selection lines, and said second terminal of each of said selection transistor is connected to a reference-potential region while reading and programming said memory cells, wherein each of the memory cells comprises a first and a second conductive region arranged in said semiconductor material body and set at a distance from one another by a channel region; a third conductive region extending in said second direction and forming one of said row-selection lines; a first plug extending on top of said semiconductor material body and in contact with said first conductive region; a second plug extending on top of said semiconductor material body and in contact with said second conductive region; a resistive region extending on top of, and in contact with, said first plug; a chalcogenic material strip extending on top of, and in contact with, said resistive region in said first direction; and a fourth conductive region extending parallel to and in contact with said chalcogenic material strip and forming one of said column-selection lines.

7. The phase-change nonvolatile memory array according to claim 6 wherein each memory cell has a symmetrical structure with respect to said first plug and comprises a fifth conductive region arranged symmetrically with respect to said third conductive region; a sixth conductive region arranged symmetrically with respect to said second conductive region; and a third plug arranged symmetrically with respect to said second plug, said third and fifth conductive regions forming a split-gate electrode.

8. A phase-change nonvolatile memory array, comprising:
a reference-potential region;
a plurality of column-selection lines extending in a first direction;
a plurality of word-selection lines extending in a second direction, orthogonal to the first direction; and
a plurality of memory cells, each of said memory cells comprising a PCM storage element and a corresponding selection transistor connected in series between one of the column selection lines and the reference-potential region, each of said selection transistors having a control terminal connected to a respective one of said word-selection lines, wherein said selection transistor is a low-threshold NMOS transistor.

9. A phase-change nonvolatile memory array, comprising:
a reference-potential region;
a plurality of column-selection lines extending in a first direction;
a plurality of word-selection lines extending in a second direction, orthogonal to the first direction;
a plurality of memory cells, each of said memory cells comprising a PCM storage element and a corresponding selection transistor connected in series between one of the column selection lines and the reference-potential region, each of said selection transistors having a control terminal connected to a respective one of said word-selection lines; and
a column-decoder circuit that includes PMOS transistors connected in series between a supply line and a respective one of the column-selection lines.

10. A Phase-change nonvolatile memory array, comprising:
a reference-potential region;
a plurality of column-selection lines extending in a first direction;
a plurality of word-selection lines extending in a second direction, orthogonal to the first direction;
a plurality of memory cells, each of said memory cells comprising a POM storage element and a corresponding selection transistor connected in series between one of the column selection lines and the reference-potential region, each of said selection transistors having a control terminal connected to a respective one of said word-selection lines;
a column-decoder circuit having an input connected to a supply line and a plurality of outputs respectively connected to the column-selection lines; and
a plurality of function-selection transistors respectively connected between the outputs of said column-decoder circuit and the column-selection lines, each function-selection transistor having a control terminal receiving an operation-selection signal.

11. A phase-change nonvolatile memory array, comprising:
a reference-potential region;
a plurality of column-selection lines extending in a first direction;
a plurality of word-selection lines extending in a second direction, orthogonal to the first direction;
a plurality of memory cells, each of said memory cells comprising a PCM storage element and a corresponding selection transistor connected in series between one of the column selection lines and the reference-potential region, each of said selection transistors having a control terminal connected to a respective one of said word-selection lines; and
a semiconductor material body; wherein each of the memory cells comprises a first and a second conductive region arranged in said semiconductor material body and set at a distance from one another by a channel region; a third conductive region extending in said second direction and forming one of said row-selection lines; a first plug extending on top of said semiconductor material body and in contact with said first conductive region; a second plug extending on top of said semiconductor material body and in contact with said second conductive region; a resistive region extending on top of, and in contact with, said first plug; a chalcogenic material strip extending on top of, and in contact with, said resistive region in said first direction; and a fourth conductive region extending parallel to and in contact with said chalcogenic material strip and forming one of said column-selection lines.

12. The phase-change nonvolatile memory array of claim 11 wherein each memory cell has a symmetrical structure with respect to said first plug and comprises a fifth conductive region arranged symmetrically with respect to said third conductive region; a sixth conductive region arranged symmetrically with respect to said second conductive region; and a third plug arranged symmetrically with respect to said second plug, said third and fifth conductive regions forming a split-gate electrode.

13. A phase-change nonvolatile memory array, comprising:

a ground region;

a plurality of column-selection lines extending in a first direction;

a plurality of word-selection lines extending in a second direction, orthogonal to the first direction; and a plurality of memory cells, each of said memory cells comprising a PCM storage element and a corresponding selection transistor connected in series between one of the column selection lines and the ground region, and having a control terminal connected to a respective one of said word-selection lines, each of said selection transistors being a low-threshold, natural transistor without a threshold-modification implant and having a control terminal connected to a respective one of said word-selection lines.

14. The phase-change nonvolatile memory array of claim 13 further comprising a column-decoder circuit that includes PMOS transistors connected in series between a supply line and a respective one of the column-selection lines.

* * * * *